United States Patent [19]

Linares

[11] 4,234,376

[45] Nov. 18, 1980

[54] GROWTH OF SINGLE CRYSTAL BERYLLIUM OXIDE

[75] Inventor: Robert C. Linares, Sherborn, Mass.

[73] Assignee: Allied Chemical Corporation, Morris Township, Morris County, N.J.

[21] Appl. No.: 80,371

[22] Filed: Oct. 1, 1979

[51] Int. Cl.³ ............................................ C30B 15/14
[52] U.S. Cl. .............................. 156/617 SP; 156/619; 156/DIG. 89
[58] Field of Search .......... 156/617 SP, 619, DIG. 89

[56] References Cited

U.S. PATENT DOCUMENTS 3,768,983  10/1973  Elkins et al. ........................ 156/619

OTHER PUBLICATIONS

J. Crystal Growth, 42 (1977), 473–482, Hurle.

Primary Examiner—Hiram H. Bernstein
Attorney, Agent, or Firm—James Riesenfeld; Gerhard H. Fuchs

[57] ABSTRACT

A process for rapid growth of large single crystals of beryllium oxide of a high degree of perfection is provided. The crystals are grown by top seeding in a substantially oxygen-and water vapor-free atmosphere from molten mixtures of BeO and one or more other metal oxides. Critical parameters include seed crystal orientation, rotation and pull rates and induction heating frequency. Resultant crystals are useful as substrates and windows in electronic and laser applications.

12 Claims, 1 Drawing Figure

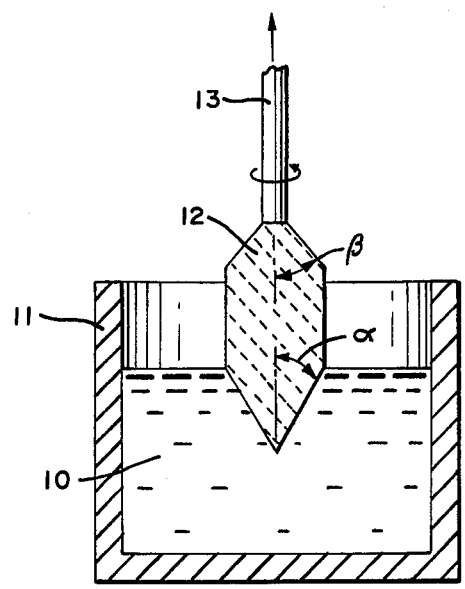

GROWTH OF SINGLE CRYSTAL BERYLLIUM OXIDE

BACKGROUND OF THE INVENTION

1. Field of the Invention

This invention relates to a crystal growing process and more particularly to a process for growing single crystals of beryllium oxide from high temperature molten mixtures.

2. Description of the Prior Art

Beryllium oxide (BeO) is one of the most refractory, strong, and chemically inert oxides. However, because it is highly toxic, its use has been limited to applications which require its unique properties. Among the properties which have been exploited are its exceptionally high thermal conductivity combined with high electrical resistivity.

Initial interest in the growth of single crystal beryllium oxide resulted from the need to obtain pure samples on which to make more exact physical properties measurements. It was also demonstrated that single crystal films of silicon and gallium arsenide could be grown epitaxially on selected planes of BeO. Semiconductor devices based on silicon grown epitaxially on sapphire are commercially available, and experimental microwave devices based on silicon grown on BeO have been demonstrated. The higher thermal conductivity of BeO compared with silicon, gallium arsenide, and sapphire provides advantages for BeO in high output power devices. Single crystals of BeO are potentially useful as substrates for silicon and gallium arsenide single crystal films and as windows for high power ultraviolet lasers. Such applications require crystals which are completely free of inclusions, bubbles, and similar defects and which are about 1.5 cm to 2.5 cm diameter and at least 1 cm long. Such crystals are not available commercially. Furthermore, growth rates by existing methods are so slow as to severely restrict or preclude commercial use of these methods.

Thus, there is a need to prepare BeO single crystals with a high degree of perfection, to prepare the crystals rapidly and to prepare crystals large enough to serve as substrates for semiconductor single crystal films and as ultraviolet laser windows.

Preparation of single crystals of BeO from melts containing BeO and calcium oxide (CaO) is disclosed in U.S. Pat. No. 3,768,983, issued Oct. 30, 1973 to Elkins et al. However, that patent fails to disclose the composition of the atmosphere over the melt, induction heating frequency, seed crystal orientation and seed rotation and pull rates, which have been found to be critical in the growth of defect-free single crystals of BeO.

SUMMARY OF THE INVENTION

According to the present invention, beryllium oxide single crystals are grown by a process which comprises preparing a mixture comprising BeO and a second metal oxide wherein the BeO comprises about 45 to 80 mol percent of said mixture, providing over said mixture a gaseous atmosphere substantially free of oxygen and water vapor, heating said mixture to a temperature at which the mixture becomes molten, lowering the temperature of said molten mixture to an intermediate temperature of about 1850° C. to 2050° C., placing into the surface of said molten mixture a beryllium oxide seed crystal having an orientation within about 15° of (0001), rotating said seed crystal at about 1 to 15 rpm, pulling said seed crystal from said molten mixture at a rate of about 0.005 to 0.6 mm/hr and lowering the temperature at a rate of about 0.1° C./hr to 10° C./hr while heating said molten mixture using an induction heating frequency less than about 100 kHz, whereby beryllium oxide from said molten mixture grows on said seed crystal. The other metal oxide(s) of the mixture remain in the melt.

The process of the present invention yields BeO single crystals which are substantially free of inclusions and polar twinning and have less than about 4 dislocations per $cm^3$. The high perfection is evidenced by the high vacuum-ultraviolet transmission and the lack of impurity bands in the ultraviolet. BeO single crystals as heavy as 25 g have been grown by the process at rates up to 0.6 mm/hr. Crystals suitable for use as substrates for semiconductor single crystal films and as windows for high power utraviolet lasers can be prepared by the process of this invention.

BRIEF DESCRIPTION OF THE DRAWING

The FIGURE shows a sectional view of a BeO single crystal of this invention growing from a melt.

DETAILED DESCRIPTION OF THE INVENTION

In the preferred embodiment of this invention, the melt mixture employed for preparation of high quality BeO single crystals comprises about 70 to 80 mol percent BeO and about 30 to 20 mol percent CaO. Similar high quality single crystals may be grown from melts containing BeO and other metal oxides, such as strontium oxide (SrO), magnesium oxide (MgO), zirconium oxide ($ZrO_2$) and mixtures thereof.

In practicing this invention, it is important to maintain over the melt an atmosphere which is substantially free of oxygen and water vapor. Crystals may be grown in atmospheres of various gases, such as nitrogen or argon. The gaseous atmosphere generally contains less than about 500 ppm of oxygen, and preferably less than about 200 ppm of oxygen. If the oxygen concentration exceeds 500 ppm, excessive oxidation and transport of the iridium crucible material occurs. This results in the crystal being coated with iridium and in excessive wear of the crucible.

The gases in the growth atmosphere may be dried by passing them through a silica gel trap. Alternatively, a cold trap or other gas-drying methods well known in the art may be used. Failure to dry the gas adequately can result in transport of BeO by the formation of volatile beryllium hydroxide.

After first melting the metal oxide mixture, the temperature of the melt is lowered about 50° C. to an intermediate temperature of about 1850° C. to 2050° C., preferably within a range of about 1900° C. to 2040° C. Crystals grown with intermediate temperatures above about 2050° C. are heavily twinned and fracture on cooling, as they change from the α phase (above 2050° C.) to the β phase (below 2050° C.). At intermediate temperatures below about 1850° C., the growth rate of the crystal exceeds the rate of solvent diffusion away from the growth interface, solvent atoms are trapped at and surrounded by the advancing crystal surface and inferior quality crystals result.

An important element of the process of this invention is penetration of the induction heating field through the crucible wall. Penetration depth increases with decreasing frequency. Crucible wall thickness of at least about 1.5 mm is preferred to provide adequate strength. For crucible wall thicknesses up to 2 mm, complete penetration requires that induction heating frequency be less than about 100 kHz. Preferably, this frequency is in the range from about 5 kHz to 50 kHz and especially from about 8 kHz to 12 kHz. The latter frequency range is preferred, because solid state power sources are readily available in this range. Induction heaters operating at frequencies near and below 1 kHz tend to be noisy. Resistance heating using 60 Hz current is suitable for practicing this invention but is not preferred.

The rate and perfection of single crystal growth on the BeO seed depends on its crystal orientation. Highly perfect single crystals can be grown on (0001) seeds at rates up to 0.6 mm/hr. Crystals grown on (000$\bar{1}$) and (10$\bar{1}$1) seeds are marred by inclusions, while inclusion-free growth on a (10$\bar{1}$0) seed proceeds no faster than 0.05 to 0.1 mm/hr. Thus seed crystals for this invention must be oriented within about 15° of (0001), preferably within about 5°.

The FIGURE depicts in cross section a BeO single crystal growing from the melt by the process of this invention. Molten metal oxide 10 is contained in crucible 11 which is surrounded by an induction heating coil (not shown). The growing crystal 12 is rigidly supported by seed rod 13, which transmits controlled rotational and linear motion to the growing crystal. In a preferred embodiment, seed rod 13 is attached directly to an electronic balance (not shown) and the entire balance assembly rotates with the seed rod. The balance continuously monitors crystal weight and generates an electrical signal proportional to the weight. This signal is compared with a programmed simulated weight signal to generate a difference, or error, signal. The error signal is fed to a power control which decreases or increases the melt temperature if the weight is too low or high, respectively. Thus, growth is maintained at a rate which is programmed in advance. Additional details of growth control techniques are described by J. T. Hurle, J. Cryst. Growth 42, 473 (1977).

In the early stages of growth the crystal diameter increases linearly with time to form a "shoulder". The angle $\beta$ between the shoulder and the axis of the crystal is called the "bring out angle" and is controlled by the "pull rate," the rate at which seed rod 13 is raised from the melt, as well as by the melt temperature. The preferred bring out angle depends on the crucible diameter. For crucible diameters of 4.1, 5.1 and 7.6 cm, the ideal bring out angles are 30°, 50°, and 90° respectively. To achieve the preferred bring out angle the pull rate should be in the range from 0.005 to 0.6 mm/hr and preferably from 0.2 to 0.3 mm/hr during growth to full diameter.

Once the crystal reaches full diameter, the rotation rate is chosen to maintain the interface angle $\alpha$ (the angle between the growing crystal surface and the crystal axis) at about 30°. Preferably, this angle is maintained between about 20° and 40° and more preferably between about 25° and 35°. At an interface angle of 30° the growing crystal is bounded by (10$\bar{1}$1) planes. To achieve the preferred range of interface angle, rotation rates should be about 1 to 15 rpm and preferably about 5 to 10 rpm.

The following examples are presented in order to provide a more complete understanding of the invention. The specific techniques, conditions, materials and reported data set forth to illustrate the principles and practice of the invention are exemplary and should not be construed as limiting the scope of the invention.

EXAMPLE 1

A BeO crystal was grown in a 5.1 cm diameter×7.6 cm high iridium crucible from a melt containing 180 g BeO and 130 g CaO in an atmosphere substantially free of oxygen and water vapor. The mixture was melted at about 2050° C., after which its temperature was reduced to about 2000° C. A BeO seed crystal having (0001) orientation was placed into the surface of the molten mixture, rotated at 10 rpm and pulled at 0.2 mm/hr, while the molten mixture was heated with an induction heating frequency of 10 kHz. Growth rate, which includes melt drop and interface shape changes as well as pull rate, was 0.6 mm/hr. Growth to diameter was 40 hours. The final crystal was 1.9 cm diameter and 7.6 cm long, weighed 25 g and was essentially inclusion-free.

EXAMPLE 2

A BeO crystal was grown from the same materials and under substantially the same conditions as in Example 1, except that the induction heating frequency was 50 kHz. The final crystal was essentially inclusion-free.

EXAMPLE 3

A BeO single crystal was grown from a melt containing 170 g BeO and 202 g SrO. Crucible and growth conditions were substantially the same as for Example 1, except the crystal growth rate was 0.5 mm/hr. The resulting crystal was essentially inclusion-free.

EXAMPLE 4

A BeO single crystal was grown from a melt containing 72 g MgO, 171 g ZrO$_2$ and 87.6 g BeO. Crucible and growth conditions were substantially the same as for Example 1, except that the mixture was melted at about 2000° C. and then cooled to 1950° C. Pull rate was 0.1 mm/hr and growth rate 0.2 mm/hr. The resulting crystal was essentially inclusion-free.

EXAMPLE 5

A BeO crystal was grown from the same materials and under substantially the same conditions as in Example 4, except that the induction heating frequency was 50 kHz. The final crystal was essentially inclusion-free.

I claim:
1. A process for growing beryllium oxide single crystals comprising the steps of:
   (a) preparing a mixture comprising beryllium oxide and a second metal oxide wherein beryllium oxide comprises about 45 to 80 mol percent of said mixture,
   (b) providing over said mixture a gaseous atmosphere substantially free of oxygen and water vapor,
   (c) heating said mixture to a temperature at which the mixture becomes molten,
   (d) lowering the temperature of said molten mixture to an intermediate temperature of about 1850° C. to 2050° C.,
   (e) placing into the surface of said molten mixture a beryllium oxide seed crystal having an orientation within about 15° C. of (0001),
   (f) rotating said seed crystal at about 1 to 15 rpm,
   (g) pulling said seed crystal from said molten mixture at a rate of about 0.005 to 0.6 mm/hr and
   (h) lowering the temperature at a rate of about 0.1° C./hr to 10° C./hr while heating said molten mix- ture using an induction heating frequency less than about 100 kHz so that beryllium oxide from said molten mixture grows on said seed crystal.

2. The process of claim 1 wherein said second metal oxide is selected from the group consisting of calcium oxide, strontium oxide, magnesium oxide, zirconium oxide and mixtures thereof.

3. The process of claim 2 wherein said second metal oxide is calcium oxide.

4. The process of claim 3 wherein said beryllium oxide comprises about 70 to 80 mol percent of said mixture.

5. The process of claim 4 wherein said gaseous atmosphere contains less than about 200 ppm of oxygen.

6. The process of claim 1 wherein the intermediate temperature to which said molten mixture is lowered in step (d) is about 1900° C. to 2040° C.

7. The process of claim 1 wherein said induction heating frequency is maintained between about 5 kHz and 50 kHz.

8. The process of claim 1 wherein said induction heating frequency is maintained between about 8 kHz and 12 kHz.

9. The process of claim 1 wherein said seed crystal placed into said surface has an orientation within about 5° of (0001).

10. The process of claim 1 wherein said seed crystal is rotated at about 5 to 10 rpm.

11. The process of claim 1 wherein said seed crystal is pulled from said melt at a rate of about 0.2 to 0.3 mm/hr.

12. The process of claim 1 further comprising between steps (g) and (h) generating a signal responsive to the weight of the pulled crystal, said signal controlling the rate of heating in step (h).

* * * * *